United States Patent [19]

Chan et al.

[11] Patent Number: 5,451,535
[45] Date of Patent: Sep. 19, 1995

[54] METHOD FOR MANUFACTURING A MEMORY CELL

[75] Inventors: Kevin K. Chan, Staten Island; Sang H. Dhong, Mahopac; Dieter P. E. Kern, Amawalk; Young H. Lee, Somers, all of N.Y.

[73] Assignee: International Business Machines Corporation, Armonk, N.Y.

[21] Appl. No.: 247,170

[22] Filed: May 20, 1994

Related U.S. Application Data

[62] Division of Ser. No. 901,281, Jun. 19, 1992, Pat. No. 5,331,189.

[51] Int. Cl.[6] .............. H01L 21/336; H01L 21/8247
[52] U.S. Cl. .................................... 437/43; 437/44; 437/52; 437/978
[58] Field of Search ............ 437/43, 52, 44, 978; 257/320, 321

[56] References Cited

U.S. PATENT DOCUMENTS

| | | | |
|---|---|---|---|
| 4,099,196 | 7/1978 | Simko | 307/238.3 |
| 4,274,012 | 6/1981 | Simko | |
| 4,314,265 | 2/1982 | Simko | |
| 4,334,347 | 6/1982 | Goldsmith | |
| 4,404,577 | 9/1983 | Cranford, Jr. et al. | |
| 4,458,407 | 7/1984 | Hoeg et al. | 257/321 |
| 4,656,729 | 4/1987 | Kroll, Jr. et al. | 437/52 |
| 4,665,417 | 5/1987 | Lam | |
| 4,774,202 | 9/1988 | Pan et al. | 437/43 |
| 4,795,719 | 1/1989 | Eitan | 437/43 |
| 4,814,286 | 3/1989 | Tam | 437/27 |
| 4,967,393 | 10/1990 | Yokoyama et al. | 365/185 |
| 4,980,309 | 12/1990 | Mitchell et al. | 437/43 |
| 4,994,403 | 2/1991 | Gill | 437/43 |
| 4,996,572 | 2/1991 | Tanaka et al. | |
| 5,017,505 | 5/1991 | Fujii et al. | 437/52 |
| 5,063,172 | 11/1991 | Manley | 437/43 |
| 5,256,584 | 10/1993 | Hartmann | 437/43 |

FOREIGN PATENT DOCUMENTS

| | | | |
|---|---|---|---|
| 0436156A1 | 7/1991 | European Pat. Off. | |
| 61-147576 | 11/1986 | Japan | |
| 62-125675 | 6/1987 | Japan | 257/321 |
| 62-125677 | 6/1987 | Japan | 437/43 |
| WO90/16085 | 12/1990 | WIPO | |

OTHER PUBLICATIONS

D. J. DiMaria et al, "High current injection into SiO$_2$ . . . ", *J. Appl. Phys.*, 51(5), May 1980, pp. 2722-2735.
D. J. DiMaria et al., "Dual electron injector structure", *Appl. Phys. Lett.* 37(1), 1 Jul. 1980, pp. 61-64.
A. Thomsen et al., "A Floating Gate MOSFET With Tunneling Injector . . . ", *IEEE Electron Device Letters*, vol. 12, No. 3, Mar. 1991, pp. 111-113.

*Primary Examiner*—T. N. Quach
*Attorney, Agent, or Firm*—David Aker

[57] ABSTRACT

A flash EEPROM is produced comprising multiple MOS cells. In each cell, programming and erasing are performed through tunneling from the write gate to the floating gate and by tunneling from the floating gate to the erase gate, respectively. The directional dielectric employed is a multilayered structured (MLS) oxide, where thin oxide and thin polycrystalline silicon form alternating layers. The layering is asymmetric: that is, either the uppermost or bottommost layer is thicker than the other layers. As a result of this structure, the oxide exhibits directionality, that is, the tunneling is easier in one direction than the reverse direction, and significantly enhances the tunneling phenomena (tunneling current can be observed at as low as 4.7 V). In addition, the MLS oxide can be fabricated having different dielectric constants. The directionality, coupled with the separate write and erase gates, gives the new flash EEPROM cell a number of advantages: it is low-voltage operable, it is highly resistant to disturbance and has an easily scalable structure (that is, it can be made to operate at any given voltage within a specified scale).

7 Claims, 5 Drawing Sheets

METHOD FOR MANUFACTURING A MEMORY CELL

This is a division of application Ser. No. 07/901,281, filed on Jun. 19, 1992 now U.S. Pat. No. 5,331,189.

FIELD OF THE INVENTION

This invention relates generally to nonvolatile semiconductor memory devices and materials used in their fabrication. In particular, this invention is directed to a nonvolatile Electrically Erasable Programmable Read Only Memory (EEPROM).

BACKGROUND OF THE INVENTION

In the computer industry, memory devices and methods for the storage of information have long been of critical importance. Accordingly, the improvement of semiconductor technology, and the memory elements thereby produced, is of significant value.

The term EEPROM is used for memory elements which have the ability to be erased and rewritten after fabrication. These memory cells are generally based on MOS technology and utilize a floating gate structure. In such memory cells, an electrical charge is transferred or written onto the electrically isolated floating gate thus controlling the threshold voltage of the device. A read operation differentiates between the impedance presented by a charged gate and an uncharged gate. Thus, a charged gate may be used to represent one (binary) state of the cell, an uncharged gate the other. To reverse the state of the cell, the charge is transferred off the floating gate or erased.

Typically, an EEPROM is comprised of multiple memory cells in an array or matrix-type structure, i.e. it is fabricated as a multiplicity of parallel bit or column lines which are generally perpendicular to a multiplicity of parallel word or row lines. In such an array, a single memory cell may be identified by the intersection of a specified column line with a specified row line. That cell may be programmed or erased by applying appropriate voltages to a particular column and a particular row line. EEPROMs in which erasure may be performed over the entire array or matrix of cells are referred to as flash EEPROMs. Bulk erases of this nature have an advantage in that it permits smaller cell size.

Numerous solutions have been proposed to facilitate the programming (or writing) and erasing of floating gates.

Some solutions focus on the structure or design of the memory cell. For example, one such design uses a single control gate separated from the floating gate by an insulating layer. Writing is accomplished by biasing the control gate sufficiently positive that the electron flow is induced from the floating gate to the control gate. The floating gate accordingly accumulates positive charge. To erase, the control gate is ramped negative so that the floating gate accumulates negative charge. (This approach is discussed in Lee, A New approach for the Floating Gate MOS Nonvolatile Memory, Applied Physics Letters, Vol. 31, No. 7, October 1977, pp. 475–476.)

Another common design uses both a programming gate and an erase gate. In cells based on this type of design, the floating gate is programmed by inducing electron flow from the programming gate to the control gate and erased by inducing electron flow from the floating gate to the erasure gate. (This design is exemplified in U.S. Pat. No. 4314265.)

Other solutions focus on the methods of writing or erasing the floating gate. The charge transfer mechanisms most frequently used for these purposes are hot electron injection (typically from avalanche breakdown although hot electron injection may also result from channel hot electrons) or Fowler-Nordheim tunneling.

Hot-Electron Injection

A typical method of using the hot electron injection to perform a data write operation requires that a voltage be applied to a drain region of the memory cell and the control gate. The applied voltage causes elections in the channel region located under the floating gate to be injected into the floating gate. The hot electrons will be set at a predetermined potential by the high voltage applied to the control gate. The injection of electrons in the floating gate will increase the threshold voltage in the channel region. To erase, a high voltage is applied to the erase gate resulting in electrons from the floating gate being discharged into the erase gate.

There are certain drawbacks to this method of charge transfer. While relatively low voltage is required to program a memory cell by hot electron injection, an additional power supply may be required because of high current requirements. Further, using hot injection for erasure can damage the insulator layer, resulting in cell degradation and failure. A practical effect of this condition is that the total number of writes and erase which may be carried out is limited. To put it another way, high current densities have a significant negative impact on the useful lifetime of the device.

Fowler-Nordheim Tunneling

Tunneling is an alternate method to transfer charge to a floating gate from a programming gate and from the floating gate to an erasing gate. (See, for example, U.S. Pat. No. 4,099,196, Simko, Tripler Layer Polysilicon Cell.)

Tunneling requires higher voltage than injection, but has very low current requirements. The advantage of using lower current to erase a floating gate is that such process causes less damage to the tunnel window and has a corresponding positive effect on memory cell durability and reliability. However, the higher voltages required by tunnel erasing lead to source junction field plate breakdown and the generation of hot holes.

The higher voltages used in tunneling can also cause problems to occur outside of the individual memory cell. For example, in the memory cell arrays used by flash EEPROMS, the high voltage use to write to one cell can cause another cell to be written to in error. This situation is generally referred to as erroneous data writes. This problem occurs under the following conditions. When a high voltage is applied to both the control gate and the drain to write to a specific memory cell, the voltage in the control gate may result in the floating gate of other memory cells sharing that same control gate being pulled to a high potential level. One consequence is that an electric field will be established between the floating gate and the erase gate of these other cells. Leak currents will flow between surfaces with irregularities or asperities: generally the flow from the surface with the smaller asperity to the larger asperity is larger than the leak flow in the other direction. Thus, if the asperity on the upper surface of the erase gate is larger than the lower surface of the floating gate, electrons may be travel through the insulating layer between the erase gate and the floating gate and be injected into the floating gate. The net effect is an erroneous data write.

An analogous problem occurs during an erase cycle. That is, high voltage can also cause erroneous data erasures. Clearly, reducing the probability of erroneous data writes and erases is of significant concern in the fabrication of memory cells.

Another difficulty which occurs when tunneling is used as the charge transfer mechanism is determining the optimal composition and thickness of the tunneling dielectric (that is, the layer of dielectric material used to separate the floating gate from the programming and erase gate). If the tunneling layer is relatively thick (e.g. 100 nm), higher currents are required during writing since only a small fraction of the programming current has sufficient energy to reach the floating gate through the intervening insulator. Very thin (5–20 nm) layers reduce the current required, but fabrication of such thin semiconductors can present problems in production.

In U.S. Pat. No. 4,099,196, enhanced tunneling is used to permit relatively conventional programming voltages to successfully operate with relatively thick oxides. However, even these conventional levels of current are known to degrade the insulating materials and so limit the life of the EEPROM by limiting the total number of write/erase operations that may be performed.

It is known in the art that a tunneling enhancement can be observed if a silicon-rich oxide deposited on an silicon substrate. (See, for example, D. J. DiMaria and D. W. Dong, Applied Physics Letter, 37, 61 (1980).) However, because of the non-stoichiometric nature of the silicon-rich oxide, it is difficult to control the silicon-/oxide interface, leading to a fairly large leakage current (about $3 \times 10^{-10}$A). Thus, this material has significant disadvantages when used in a memory cell.

SUMMARY OF THE INVENTION

Accordingly, it is an object of the present invention to provide device structures and dielectric materials which enable an EEPROM to operate at relatively low voltages avoiding problems such as unwanted generation of hot holes, erroneous data writes and erroneous data erasures.

It is a further object to provide a device structure and dielectric material which increases the number of operations that may be performed, thus lengthening the EEPROMs useful life.

It is a further object to provide a dielectric material whose dielectric constant can be controlled so that it may be scaled to accommodate the electrical properties of various devices.

Other objects and advantages of the present invention will be apparent to those skilled in the relevant art in view of the following description of the invention, the appended claims and the accompanying drawings.

In achieving the above mentioned and other objects, advantages and features of the present invention, a flash EEPROM is produced comprising multiple MOS cells. In each cell, programming and erasing are performed through tunneling from the write gate to the floating gate and by tunneling from the floating gate to the erase gate, respectively. The tunneling layer employed is a multilayered structured (MLS) oxide, where thin oxide and thin polycrystalline silicon form alternating layers. This layering is asymmetric: that is, either the uppermost or bottommost layer is thicker than the other layers. As a result of this structure, the oxide exhibits directionality, that is, the tunneling is easier in one direction than the reverse direction. In addition, the MLS oxide significantly enhances the tunneling phenomena (tunneling current can be observed at as low as 4.7 V). Finally, by varying the thickness and number of the layers, the MLS oxide can be fabricated having different dielectric constants, The directionality, coupled with the separate write and erase gates, gives the new flash EEPROM cell a number of advantages: it is low-voltage operable, it is highly resistant to disturbance and has an easily scalable structure (that is, it can be made to operate at any given voltage within a specified scale).

DESCRIPTION OF THE DRAWINGS

FIG. 4A shows a cross-sectional view of the first directional dielectric in which tunneling movement is enhanced from the bottom of the structure to its top. FIG. 4B shows a cross-sectional view of the second directional dielectric in which tunneling is enhanced from the top of the structure to the bottom.

DETAILED DESCRIPTION OF THE INVENTION

A preferred embodiment of an EEPROM device according to this invention will be described referring to FIGS. 1 and 2.

Figure 1:
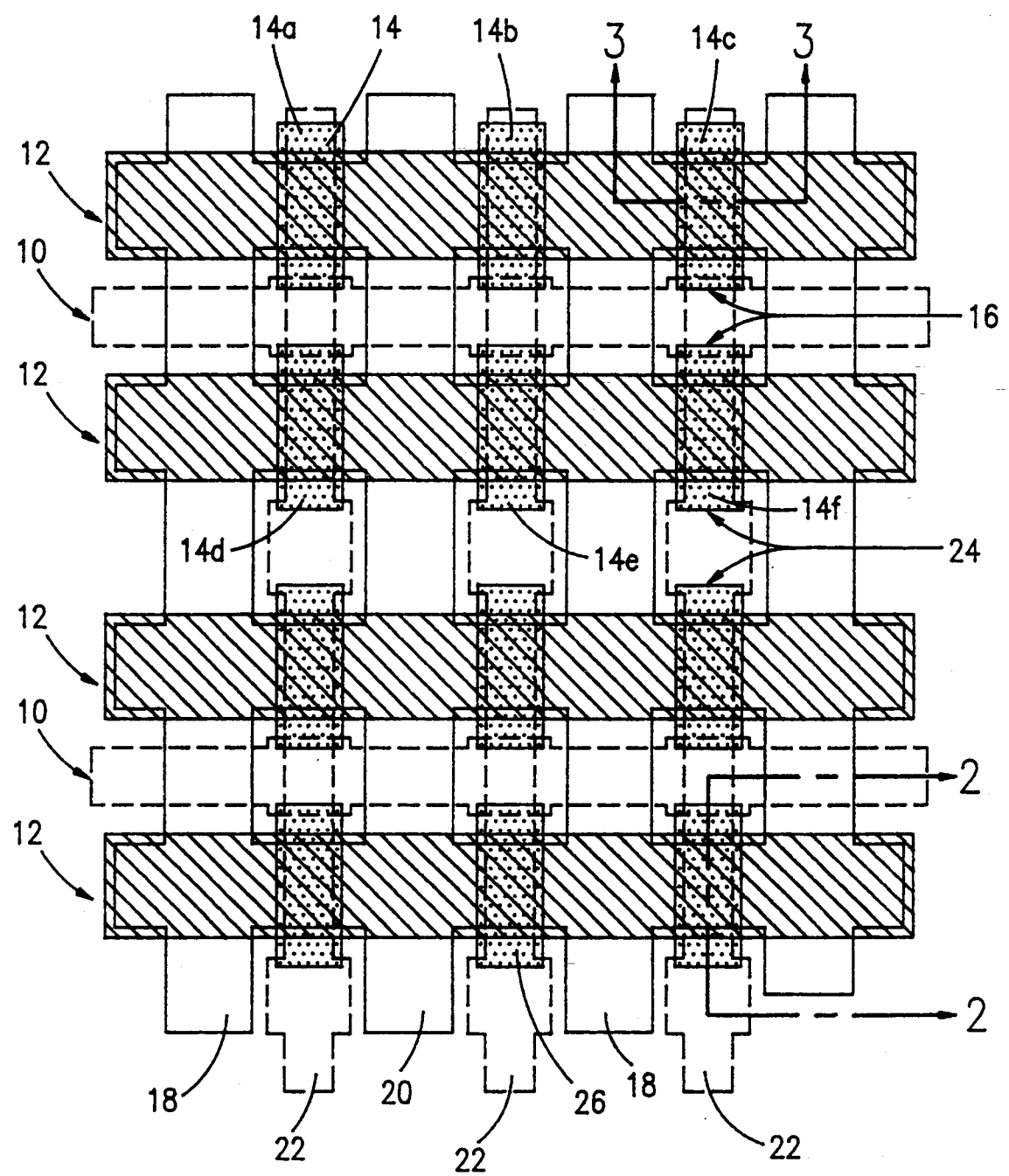
FIG. 1 shows a cut-away top view of a portion of a flash EEPROM comprised of an array of twelve memory cells. Typically, in an EEPROM, all the cells in a given memory array are fabricated at one time and, accordingly, have similar structure. As a result, an array of any column and row size may be described by reference to the twelve cells shown in FIG. 1.
Figure 4A:
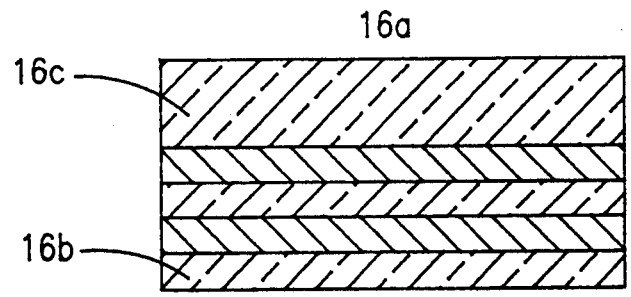
FIGS. 4A and 4B show a cross-sectional view of two examples the multilayered directional dielectric.

FIG. 1 shows the top view of one embodiment of the EEPROM in which the memory cells are arranged in a 3 by 4 array. Each cell consists of an erase gate 10 which is substantially parallel to a control gate 12, connected to a floating gate 14 through a first tunneling layer comprised of a multilayered structure tunneling (MLS) oxide 16. FIG. 4A shows a detailed cross section of the first directional dielectric 16. It will be observed that, for the first directional dielectric 16a, the oxide on the lowest layer 16b is thinner than the oxide on the uppermost layer 16c. The effect of this structure is to make tunneling from the lowest layer to the uppermost layer easier than in the reverse direction.

Returning to FIG. 1, the erase gate 10, in an erase operation, is biased to a positive voltage greater than the tunneling threshold of the first directional dielectric 16. Since any given erase gate 10 is substantially parallel to its related control gate 12 and is shared by two rows of floating gates 14a-f, all the cells connected to the selected gate 10 will be erased, resulting in a sector erase.

Sources 18 and drains 20 are as indicated. As a specific example, the substrate 5 could be p-type silicon in which Recessed Oxide (ROX) or Shallow Trench Isolation (STI) regions are formed using typical techniques. N-type sources 18 and drains 20 could then be formed in these regions using standard ion-implantation techniques. As is clear from FIG. 1, the sources 18 and drains 20 are shared with, and substantially perpendicular to, the control gate 12, eliminating the requirements of separate contacts for each cell.

The program or write gate 22 is parallel to the source 18 and drain 20 and is perpendicular to the control gate 12. To program a specific cell 26, the selected control gate 12 is raised from ground to positive voltage, capacitively coupling the voltage of the floating gate 14 to a positive value. The selected write gate 22 is lowered from ground to a negative value such that the difference between the selected write gate 22 and floating gate 14 is above the tunneling threshold voltage of the second directional multilayered directional dielectric 24. This second oxide 24 is positioned between the write gate 22 to the control gate 12.

Figure 4B:
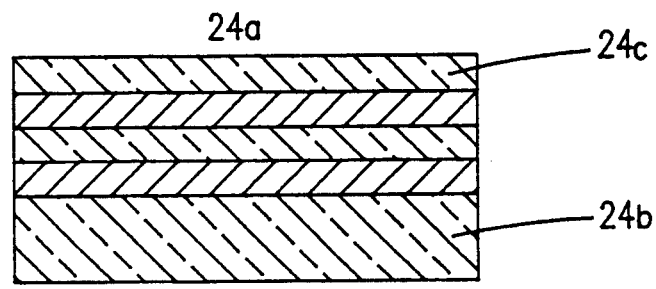

FIG. 4B shows a detailed cross section of the second directional dielectric 24a. It will be observed that, for the second directional dielectric 24a, the oxide on the lowest layer 24b is thicker than the oxide on the uppermost layer 24c. This makes tunneling from uppermost layer to the lowest layer easier than in the reverse direction.

Returning to FIG. 1, writing occurs only at the cell 26 at the cross point of the selected control gate 12 and the selected write gate 22.

It should be noted that for improved performance, the selected floating gate 14 is positively biased to one half of the tunneling threshold voltage of the first directional dielectric 16 and the selected write gate 22 is slightly more negative than one half of the tunneling threshold voltage of the second directional dielectric 24.

Figure 2:
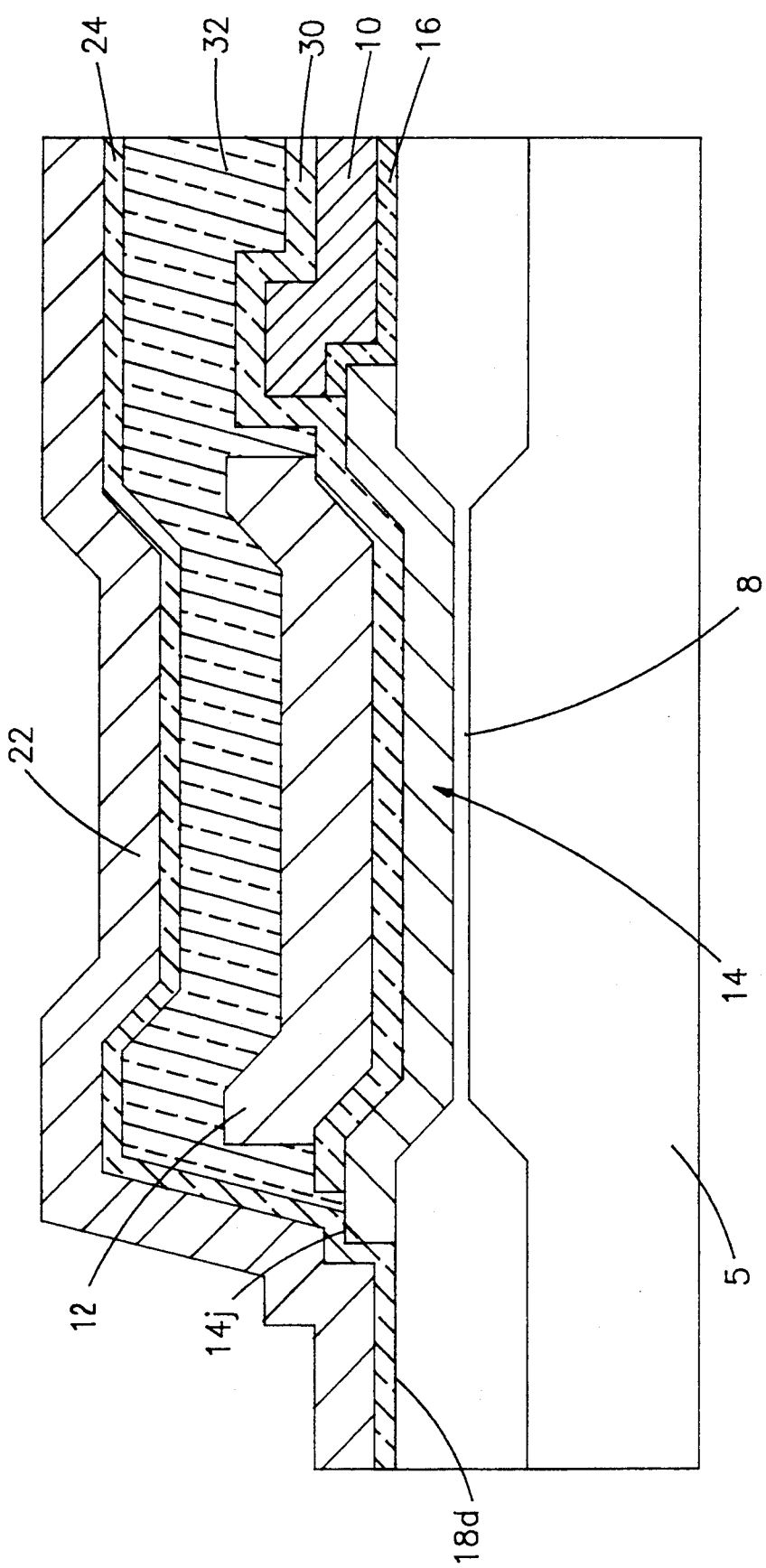
FIG. 2 shows a cross-sectional view of the flash EEPROM along the line 2—2 of FIG. 1.
Figure 3:
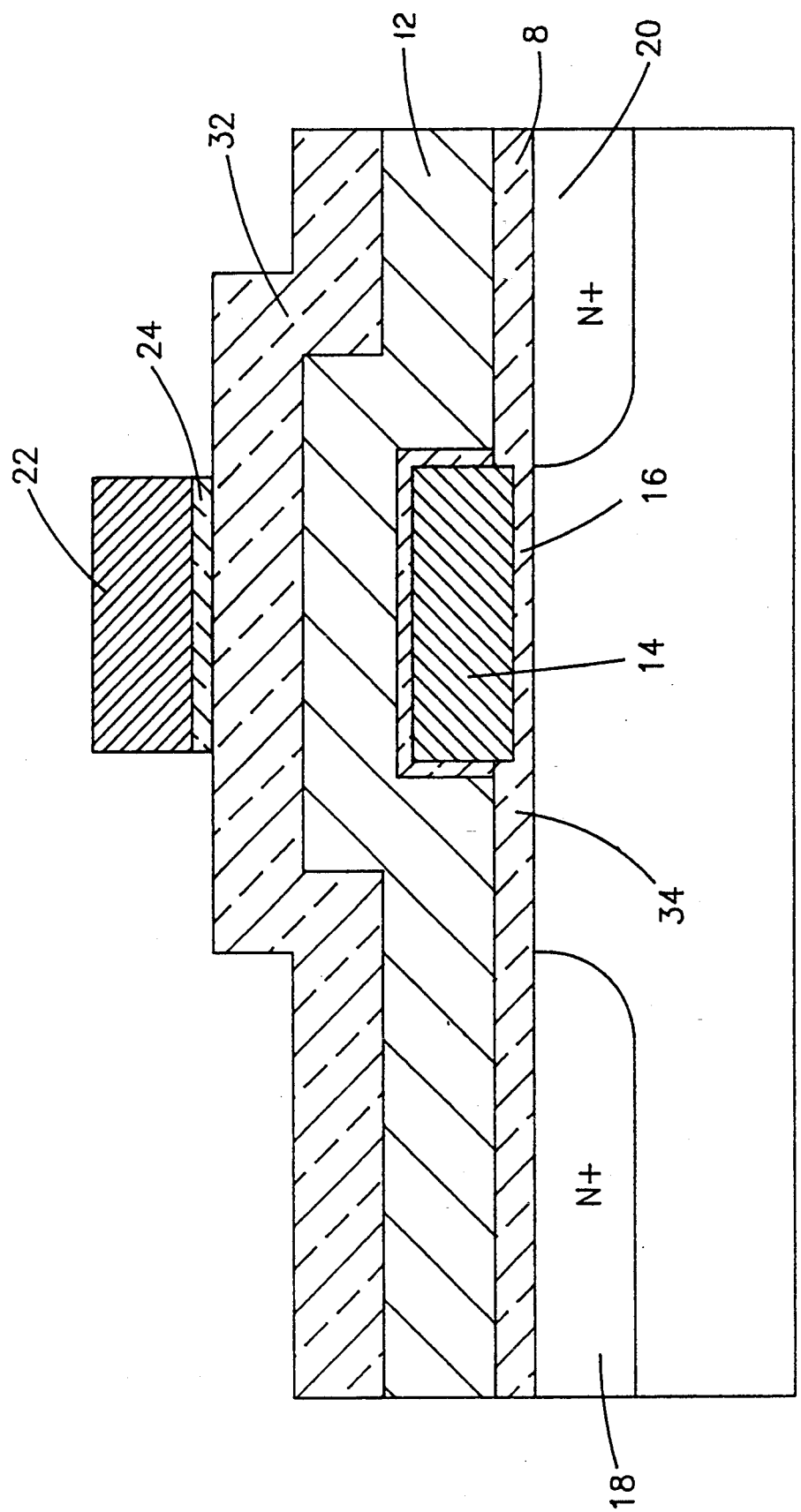
FIG. 3 shows a cross-sectional view of the flash EEPROM along the line 3—3 of FIG. 1

FIG. 2 shows a cross-section of a memory cell of the EEPROM along lines 2—2 of FIG. 1. Note that three insulating layers are shown. The first insulating layer 8 separates the substrate from the floating gate 14. The second insulating layer 30 separates the control gate 12 from the floating gate 14, the erase gate 10, and the first directional dielectric 16. The third insulating layer 32 separates the control gate 12 from the floating gate 14, the write gate 22, and the second directional dielectric 24. FIG. 3 shows a cross-section of the cell along the lines 3—3 of FIG. 1. The split gate region 34 connects the control gate 12 and the floating gate 14 in series. The connection of the enhance-mode control gate 12 in series with the floating gate 14 removes any potential problem due to over-erase.

Method of Manufacture

Figure 5:
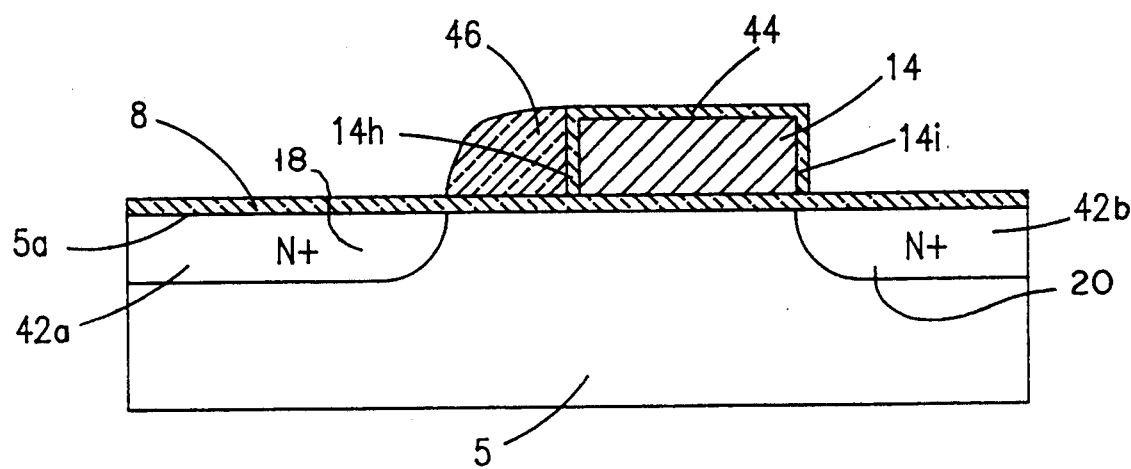
FIG. 5 shows a cross-sectional view of the flash EEPROM along the line 3—3 of FIG. 1 during fabrication. This figure shows the formation of the split gate.

The following description is for a method of manufacturing the previously described memory cells. Referring to FIG. 5, as an initial step, recessed isolation regions (ROX or STI) 42a and 42b are grown on a semiconductor substrate 5 using typical techniques, thus defining sources, drains and gate regions. A thin gate oxide 8 is then grown on the upper surface of the substrate portion 5a forming a first insulating layer. Polycrystalline silicon is deposited over this oxide. The result is etched using a photomask in a typical photolithographic process to form a floating gate 14. A thin thermal oxide 44 is grown over the floating gate 14.

Two sidewall spacers are formed on two opposite sides 14h and 14i of the floating gate 14. One of these spacers is removed by etching, using a photomask with a typical photolithographic process. This leaves a single sidewall spacer 46 as shown in FIG. 5.

Figure 6:
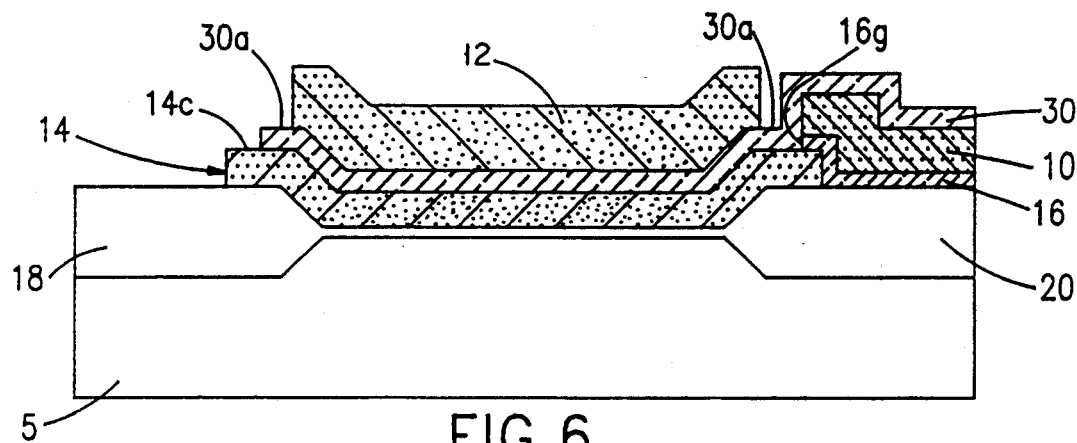
FIG. 6 shows a cross-sectional view of the flash EEPROM along the line 2—2 of FIG. 1 during fabrication, after the completion of the control gate.

Referring to FIG. 6, an ion-implantation technique is used to form a source 18 and drain 20 in the substrate 5. Multiple layers of thin oxide and thin polycrystalline silicon are deposited sequentially to form a first directional dielectric 16. As has been previously noted, a detailed depiction of the cross-section of the first directional dielectric 16 is shown in FIG. 4. Next, polysilicon is deposited on the first directional dielectric 16. Using a photomask and standard photolithographic techniques, the polysilicon and the first directional dielectric 16 are etched to form a structure which consists of an erase gate 10 on top of the first directional dielectric 16. This structure partially overlaps the floating gate 14. The configuration is shown in FIG. 6.

Continuing to refer to FIG. 6, a second insulating layer 30 of silicon dioxide is grown across the upper surface of the structure. The silicon dioxide will oxide the portion 16g of first directional dielectric uncovered by the formation of the erase gate 10. The insulating layer is etched, using a photomask and standard photolithographic techniques, to form a structure which totally overlaps the erase gate 10 and first directional dielectric 16 and partially overlaps the floating gate 14.

A polysilicon layer is deposited over the layer of silicon dioxide and etched using a photomask and standard photolithographic techniques to form a control gate 12. The etching is performed so as to expose portion 30a of the first insulating layer and 14c of the floating gate 14. It will be noted that the control gate 12 is totally insulated from the floating gate 14 by the second insulating layer 30. The resulting configuration is as shown in FIG. 6.

Referring to FIG. 2, a third insulating layer 32 is deposited over the upper surface of the structure. This layer 32 is etched using standard photolithographic techniques so that a portion 14j of the surface of the floating gate and a portion 18d of the surface of the source is exposed.

The second directional dielectric 24 is deposited over the third insulating layer 32, the exposed portion 14j of the floating gate and the exposed portion 18d of the ROX. A final polysilicon layer is deposited. It is etched using standard photolithographic techniques to form a write gate 22.

Metal lines are finished using standard CMOS processes.

Characteristics of the Tunneling Oxide

The novel characteristics of the tunneling layers, and the enhancement they provide to the operation of the EEPROM, will now be reviewed. As has been noted, FIGS. 4A and B represent cross-sections of the first 16 and second 24 directional dielectric. As can be seen, the tunneling layers are composed of alternating layers of two different materials with two different dielectric constants.

The following discussion presumes that $SiO_2$ and undoped polycrystalline silicon are the two materials used. However, it is known to those skilled in the art that other pairs of materials have similar relationships between their electrical characteristics.

The first directional dielectric is formed by creating alternating layers of $SiO_2$ and undoped polycrystalline silicon. First, 3 nm of $SiO_2$ was deposited on a silicon substrate by low pressure chemical vapor deposition. Following this, a 2.5 nm thick layer of polycrystalline silicon and a 5 nm thick layer of $SiO_2$ were sequentially deposited by low pressure chemical vapor deposition at a temperature of 700° C. It will be clear to those skilled in the art that the process of depositing the layers could be carried out by other means such as pulsed PECVD in an ECR plasma reactor at lower temperatures, such as 300° C.

Figure 7:
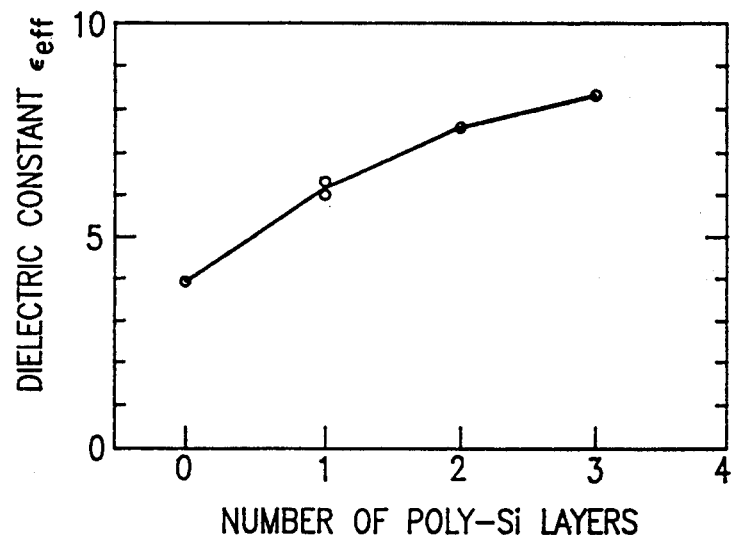
FIG. 7 is a graph showing the relationship between the effective dielectric constant and the number of polycrystalline silicon layers of the dielectric material.

Experiments have shown that the effective dielectric constant of the directional dielectric increases with the number polycrystalline silicon layers. For example, while the effective dielectric constant of $SiO_2$ is 3.9, the constant for $SiO_2$ and three alternating layers of polycrystalline silicon is 8.4. (FIG. 7 shows the relationship between the dielectric constant and the number of polycrystalline silicon layers in graphic form.) From the results of these experiments, it is projected that as the number of polycrystalline silicon layers increases further, the effective dielectric constant may level off to a value somewhat below the dielectric constant of silicon (11.9).

The actual effective dielectric constant of the multilayered directional dielectric will also depend on the composite materials used. As a result, one can create a directional dielectric of any desired dielectric constant by varying materials and number of layers. For dielectric constant lower than 3.9, polycrystalline silicon be replaced with a material with a low dielectric constant such as polymeric insulators (with dielectric constants of 1.45) or other inorganic materials of low polarizability. For a structure with a dielectric constant higher than 10, polycrystalline silicon may be replaced with a material with a high dielectric constant such as $Ta_2O_2$.

Figure 8:
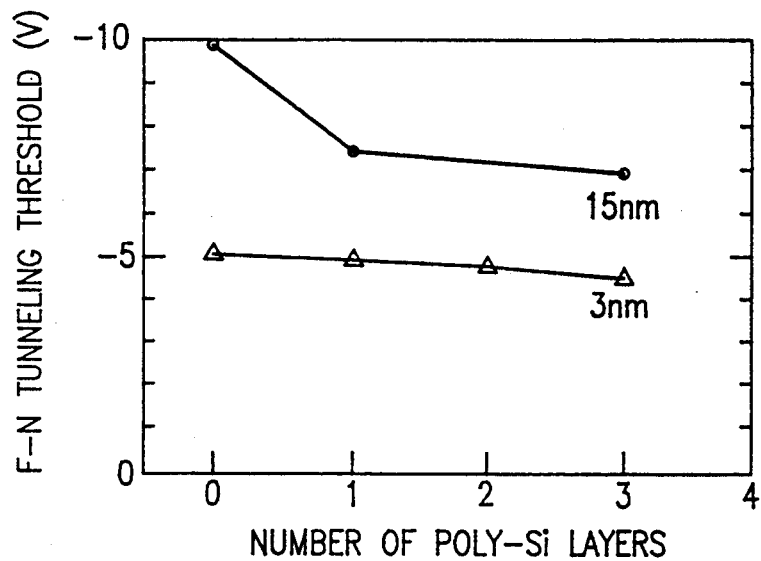
FIG. 8 is a graph showing the relationship between the threshold voltage of Fowler-Nordheim tunneling and the number of polycrystalline silicon layers of the dielectric material. The relationship is shown for two different thickness (3 and 15 nm) of the first layer of the dielectric material.

Another advantage to the multilayered directional dielectric of this invention is the variation of the threshold voltage to Fowler-Nordheim tunneling which results from a) varying the thicknesses of the $SiO_2$ layer closest to the silicon substrate, and b) increasing the number of polycrystalline silicon layers. FIG. 8 shows the results of two experiments one in which the first layer oxide was 3 nm, the second in which the first layer oxide was 15 nm. As can be seen from the graph, the threshold voltage of Fowler-Nordheim tunneling decreases as the number of polycrystalline silicon layers are increased. Additionally, the threshold voltage is very sensitive to the thickness of the first $SiO_2$ layer.

It should be noted that the present invention corrects the previously noted problem of leakage which accompanies a silicon-rich oxide deposited on a silicon substrate. By inserting a stoichiometric $SiO_2$ layer, the present invention controls the silicon/oxide interface as well as the tunneling enhancement. Specifically, the leakage current in the multilayered directional dielectric was about $10^{-11}A$ with the 3 nm thick first-layer oxide and about $10^{-12}A$ with the 15 nm thick oxide.

The directional dielectric disclosed above provide several significant benefits for semiconductor technology. First, since the dielectric constant can be controlled by varying the number of layers of polycrystalline silicon used, the resulting dielectric material can be tailored to the electrical characteristics of a specific semiconductor. Further, the Fowler-Nordheim tunneling enhancement exhibited by the material permits tunneling type charge transfer to occur at lower voltages, thus avoiding the problems, such as erroneous data write and erroneous data erase, which are caused by high voltages. Finally, the directionality of the material helps control the problem of leakage which had occurred in prior art.

Use of the directional dielectric together with the EEPROM structure discussed above results in an improved EEPROM which can operate at lower voltages and thus has a longer useful life.

It will be recognized by those skilled in the art that a) some of the above features and structures may be used without other features and structures and b) modifications (structural, operational and otherwise) may be made to the above description without departing from the spirit of the invention. For example, other equivalent techniques may be used to form the source and drain regions and other placement of the gates is possible. It will also be recognized that the directional dielectric has other applications in the field of semiconductor technology as well as in other industries.

What is claimed is:

1. A method of manufacture of a memory cell comprising the steps of:

growing recessed isolation regions extending downward from an upper surface of a semiconductor substrate;

depositing a first insulating layer on said upper surface of said substrate;

depositing a first polycrystalline silicon layer over said first insulating layer;

etching said first insulating layer and said first polycrystalline silicon layer to form a floating gate, said floating gate having four sides, an upper surface and lower surface;

growing a thin thermal oxide over said four sides and said upper surface of said floating gate;

forming a sidewall spacers on each of said first and third sides of said floating gate;

removing the first of said sidewall spacers by a photolithographic process;

forming a source and a drain in said recessed isolating regions in said substrate, said source and drain having an upper surface;

depositing a first directional dielectric material on said upper surface of said substrate and said upper surface of said floating gate;

depositing a second polysilicon layer on said first directional dielectric material;

forming an erase gate from said second polysilicon layer using photolithographic techniques, said erase gate partially overlapping said floating gate;

forming a second insulating layer on said erase gate, said first directional dielectric material, said floating gate and said upper surface of said substrate;

etching said second insulating layer using photolithographic techniques so that said second insulating layer totally overlaps said erase gate and said first directional dielectric and partially overlaps said floating gate;

depositing a third polycrystalline silicon layer over said second insulating layer;

etching said third polycrystalline silicon layer using photolithographic techniques to form a control gate, said control gate separated from said floating gate by said second insulating layer;

depositing a third insulating layer on said control gate, said second insulating layer and said floating;

etching said third insulating layer using photolithographic techniques so that said third insulating layer leaves exposed a portion of said floating gate and said upper surface of said substrate;

depositing a second directional dielectric material on said third insulating layer, said exposed portion of said floating gate and said exposed portion of said upper surface of said substrate, said second directional dielectric material having at least three layers; and depositing a third polysilicon layer on said second directional dielectric, said third polysilicon layer forming a write gate.

2. A method as in claim 1 in which:

said first directional dielectric material is comprised of at least three layers, said layers alternating between at least two materials, each of said two materials having different dielectric constants.

3. A method as in claim 2 in which the layer closest to said erase gate is thicker than the remainder of said layers.

4. A method as in claim 3 in which the first of said materials is $SiO_2$ and said second of said materials is polycrystalline silicon.

5. A method as in claim 1 in which:

said second directional dielectric material is comprised of at least three layers, said layers alternating between at least two materials, each of said two materials having different dielectric constants.

6. A method as in claim 5 in which the layer closest to said floating gate is thicker than the remainder of said layers.

7. A method as in claim 5 in which the first of said materials is $SiO_2$ and said second of said materials is polycrystalline silicon.

* * * * *